(12) United States Patent
Greathouse et al.

(10) Patent No.: US 6,867,060 B2
(45) Date of Patent: Mar. 15, 2005

(54) WAFER-LEVEL PACKAGING OF ELECTRONIC DEVICES BEFORE SINGULATION

(75) Inventors: Steve Greathouse, Chandler, AZ (US); Michele J. Berry, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 152 days.

(21) Appl. No.: 10/306,356

(22) Filed: Nov. 27, 2002

(65) Prior Publication Data

US 2004/0099917 A1 May 27, 2004

(51) Int. Cl.[7] .............................................. H01L 21/00
(52) U.S. Cl. ....................................................... 438/51
(58) Field of Search .............................. 438/50–53, 48, 438/455–456

(56) References Cited

PUBLICATIONS

Derwent Abstract 2002–068134. "Fabrication of micro electo mechanical system structure by forming the structure in vacuum area of wafer and pad outside the vacuum area." Jul. 10, 2002.*

* cited by examiner

*Primary Examiner*—Craig A. Thompson
(74) *Attorney, Agent, or Firm*—Blakely, Sokoloff, Taylor & Zafman LLP

(57) ABSTRACT

In one embodiment, the invention provides a method comprising supporting a plurality of active electronic components on a first wafer; shaping a second wafer to define a plurality of spaces, each to accommodate one of the active electronic components when the second wafer is aligned and brought into face-to-face contact with that first wafer in a contact position; moving the second wafer into the contact position; and bonding the second wafer to the first wafer in the contact position.

12 Claims, 7 Drawing Sheets ated shown in accordance with the embodi-
WAFER-LEVEL PACKAGING OF ELECTRONIC DEVICES BEFORE SINGULATION

FIELD OF THE INVENTION

This invention relates to the packaging of electronic devices such as micro electro-mechanical systems (MEMS) devices.

BACKGROUND

One challenge of packaging electronic devices such as MEMS devices is that these devices have moving parts which require space or headroom within a package to allow for free movement of the moving parts. In some cases, these devices are sensitive to moisture and atmospheric pressure. Thus, these devices must be packaged in a hermetically sealed manner wherein the moisture and atmospheric pressure is tightly controlled if the devices are to function properly. Existing packages comprise a base section to which the MEMS device is mounted, and a cover section which is secured or joined to the base section to form a cover over the MEMS device. To achieve a hermetic seal, a sealing bead is formed at the interface or joint between the base section and the cover section.

The base section and the cover section may be singulated from a blank of suitable material before being joined. In order to create the headroom for the moving parts of the MEMS device, material may be removed from the cover section by a mechanical process such as grinding. Assembly of a package using the singulated base and cover sections requiring these components to be precisely aligned during an alignment operation that must be repeated for each package. Having to repeat the alignment operation for each package adds to the cost of fabricating the package.

DETAILED DESCRIPTION

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1:
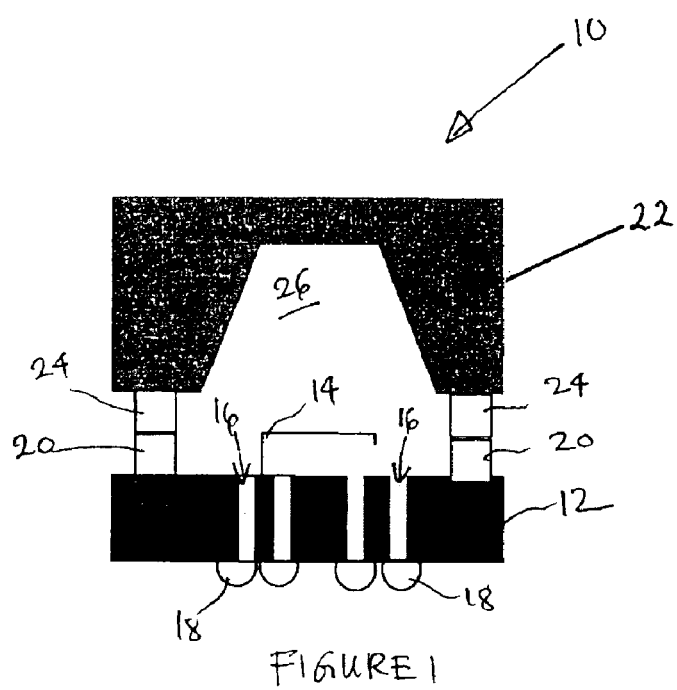
FIG. 1 shows a cross-section through an electronic device in accordance with one embodiment of the invention.

Referring now to FIG. 1 of the drawings there is shown a cross-section through an electronic device, in accordance with one embodiment of the invention. The electronic device comprises a base section 12 on which is mounted an active component in the form of a MEMS device 14. The base section 12 includes a number of vias 16 extending therethrough to allow electrical leads from the MEMS device 14 to pass therethrough to make electrical contact with electrical interconnection elements in the form of conductive solder balls 18. It will be appreciated that the electrical interconnection elements may take other forms such as copper plated contacts, nickel contacts, a conductive paste, etc. The base section 12 includes metal stand-offs 20.

The electronic 10, further comprises a cover section 22 which also includes metal stand-offs 24. The cover section 22 has a recess 26 formed therein which provides a space or headroom within which moving components of the MEMS device 14 may freely move. The base section 12 and the cover section 22 are secured together by a joint formed between stand-offs 20, and 24. In one embodiment, the joint between the stand-offs 24 and 20 may be achieved by soldering the stand-offs 20 and 24 together. As a result of the joint formed between the stand-offs 20 and 24, the base section 12 and the cover section 22, together define a hermetically formed package of the MEMS device 14. The base section 12 and the cover section 22 may be of any suitable packaging material such as silicon, ceramic, glass, etc.

In other embodiments, the base section 12 and the cover section 22 may be joined using other joining techniques such as anodic bonding, or some other wafer-to-wafer joining technique such as frit glass reflow, solder reflow, thermal compression bonding, etc.

In the case of the MEMS device 14 being a radio frequency (RF) MEMS device, the internal surfaces of the base section 12 and the cover section 22 may be coated with a metallic shielding material to shield the RF MEMS device 14, from radio frequency interference. Examples of the metallic shielding material include aluminum, copper, nickel-vanadium, etc. The metallic shielding material may be deposited using plating or sputtering techniques.

In some embodiments, the enclosure defined by the base section 12 and the cover section 22 may be filled with nitrogen or an inert gas. In other embodiments the enclosure may be vacuum sealed. These embodiments protect sensitive components of the MEMS device 14.

One advantage of the package or housing defined by the joined base section 12 and cover section 22 is that it completely encapsulates the MEMS device 14, while at the same time allowing free movement thereof. Further, the package defined by the joined base section 12 and cover section 22 may act, in some embodiments, as a radio frequency shield.

Figure 2:
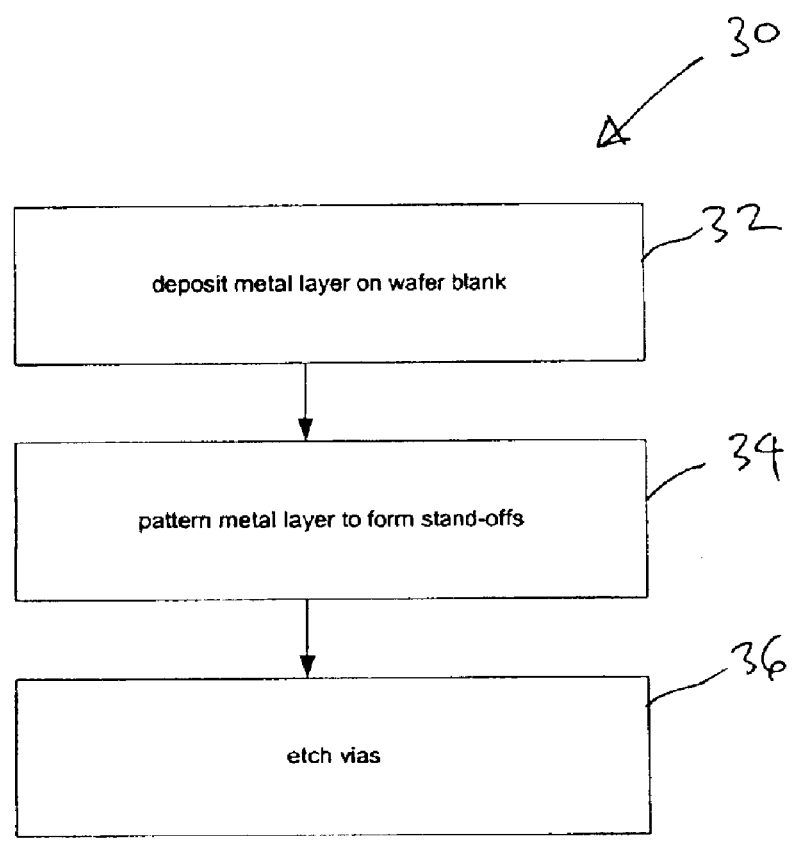
FIG. 2 shows a flowchart of operations performed on a wafer blank in accordance with one embodiment of the invention.
Figure 3:
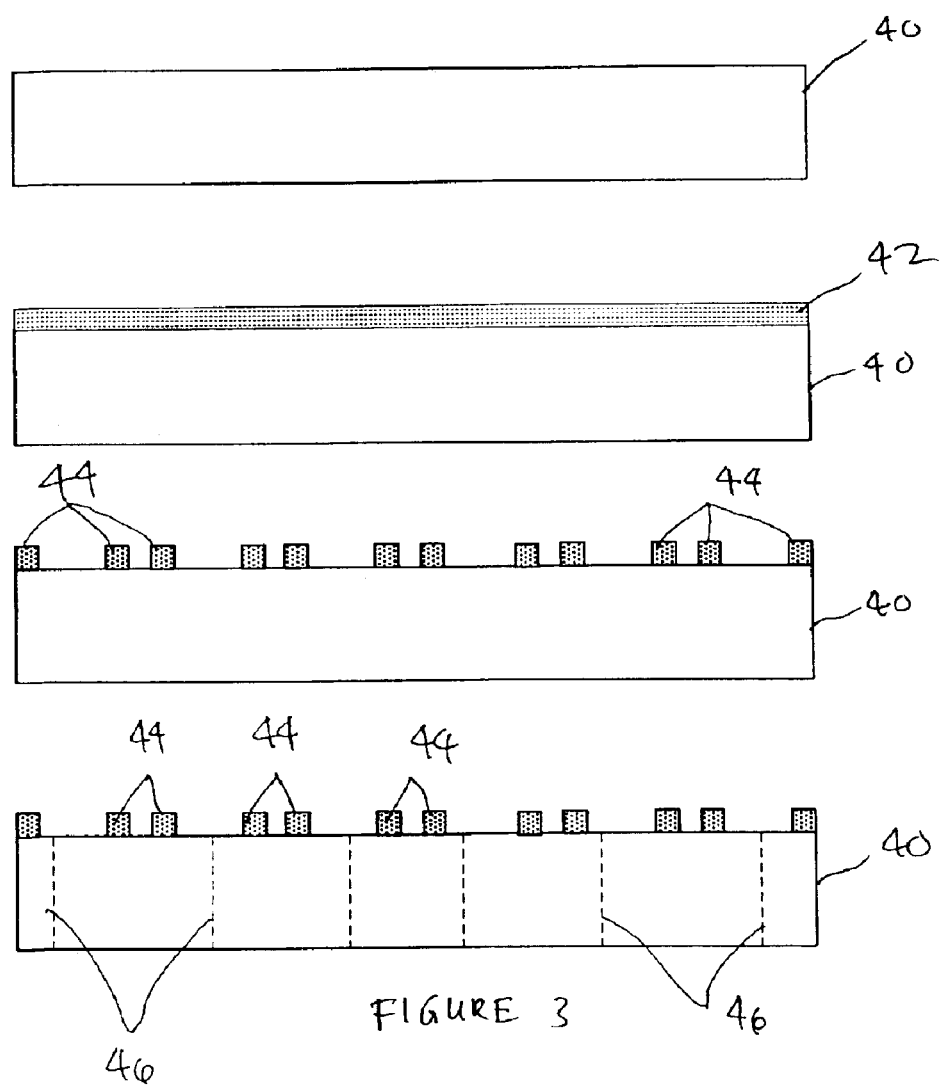
FIG. 3 shows a wafer blank after each operation shown in FIG. 2 has been performed.

Referring now to FIG. 2 of the drawings, reference number 30 generally indicates a sequence of operations performed on a wafer blank 40 (see FIG. 3 of the drawings), in accordance with one embodiment. FIG. 3 shows the wafer blank 40 after the completion of various operations shown in FIG. 2.

As will be seen in FIG. 2, at block 32 a metal layer 42 (see FIG. 3) is deposited on the wafer blank 40. Thereafter, at block 34, the metal layer 42 is patterned to form stand-offs 44 (see FIG. 3). At block 36, vias 46 (see FIG. 3), may be etched through a substrate of the wafer 40. The purpose of the vias 46 is to allow electrical or traces from an active component, such as MEMS device 14 of FIG. 1, which is mounted or formed on the wafer blank 40, to extend through the vias 46 in order to make electrical contact with electrical interconnection elements such as conductive solder balls 18.

Figure 4:
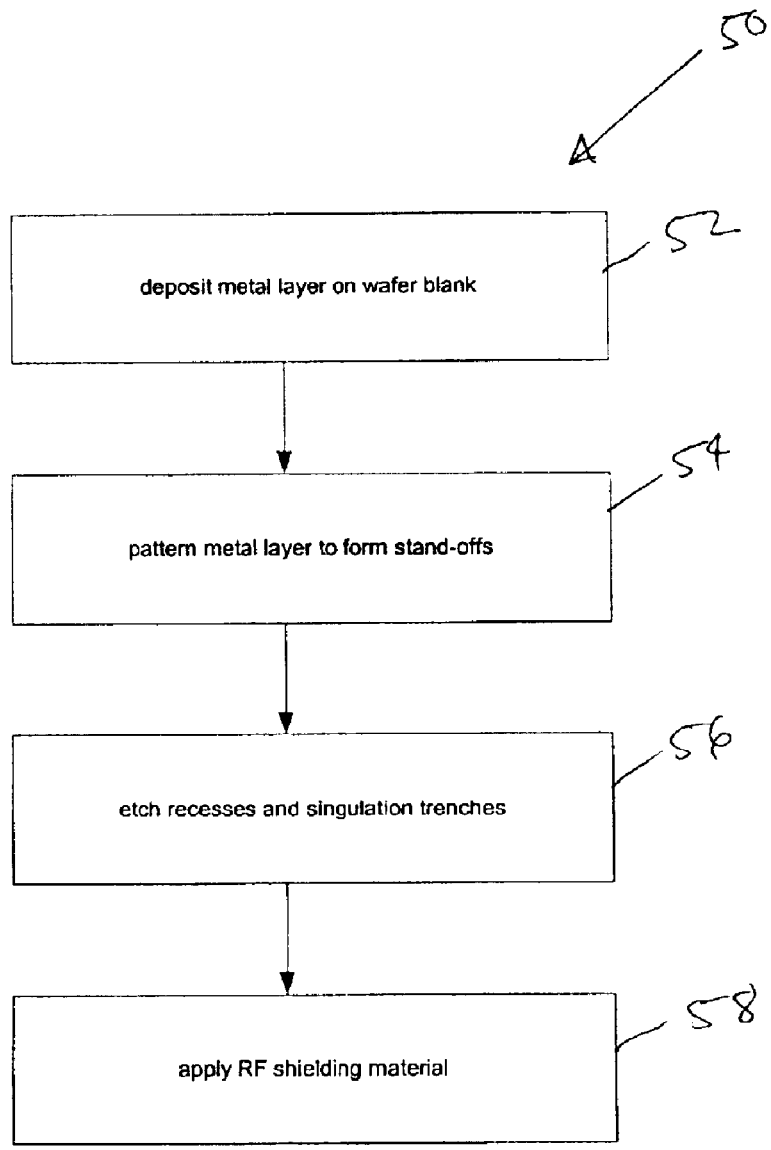
FIG. 4 shows a flowchart of operations performed on a wafer blank in accordance with another embodiment of the invention.
Figure 5:
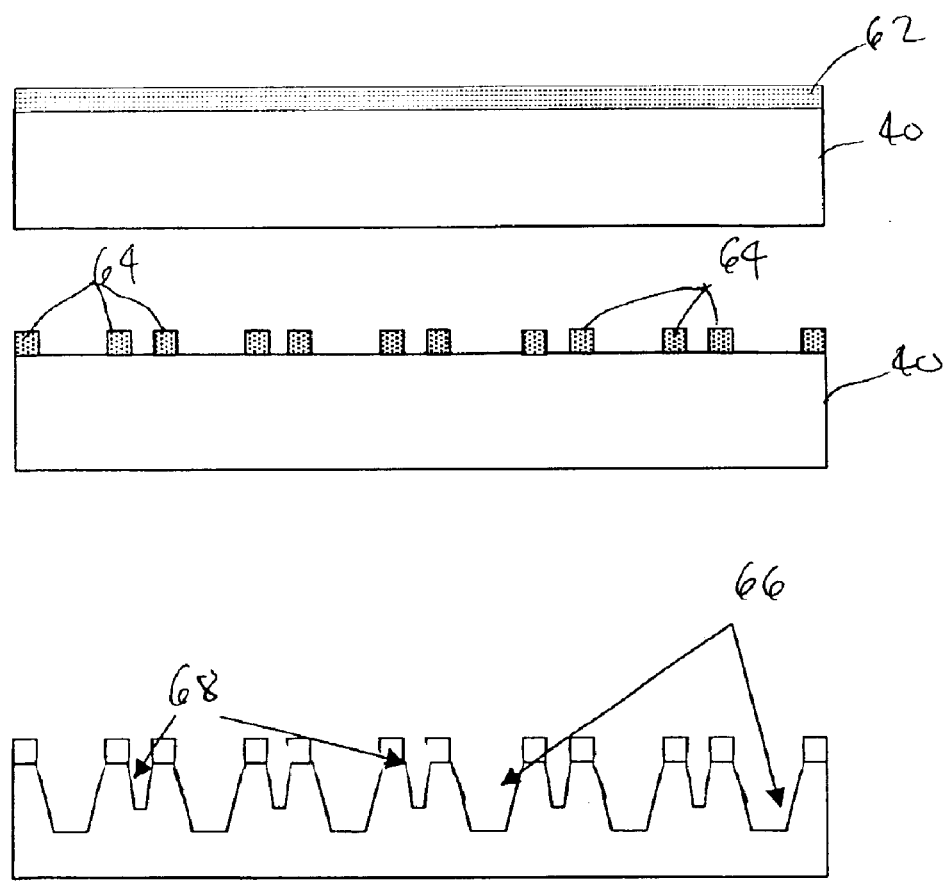
FIG. 5 shows a wafer blank after each operation shown in FIG. 4 has been performed.

Referring now to FIG. 4 of the drawings, referencing numeral 50 generally indicates a sequence of operations performed on the wafer blank 40 in accordance with one embodiment of the invention. FIG. 5 of the drawings shows the metal blank 40 after completion of some of the operations shown in FIG. 4 of the drawings.

Starting at block 52 (see FIG. 4), a metal layer 62 is deposited on the wafer blank 40. Thereafter at block 54, the metal layer 62 is patterned to form metal stand-offs 64 which are similar to the metal stand-offs 24 of FIG. 1. Thereafter at block 56, recesses 66 and singulation trenches 68 are etched into a substrate of the wafer blank 40 (see FIG. 5) using the metal stand-offs 64 as a mask. In one embodiment, a potassium hydroxide (KOH) etch process is used to etch the recesses 66 and the singulation trenches 68. The purpose of the singulation trenches 64 will be explained in greater detail below. However, it is to be noted that formation of the singulation trenches 64 is an optional step. In some embodiments vias (not shown) may be etched in the substrate of the wafer blank 40 to provide through holes for electrical interconnect elements from an active component.

Figure 6:
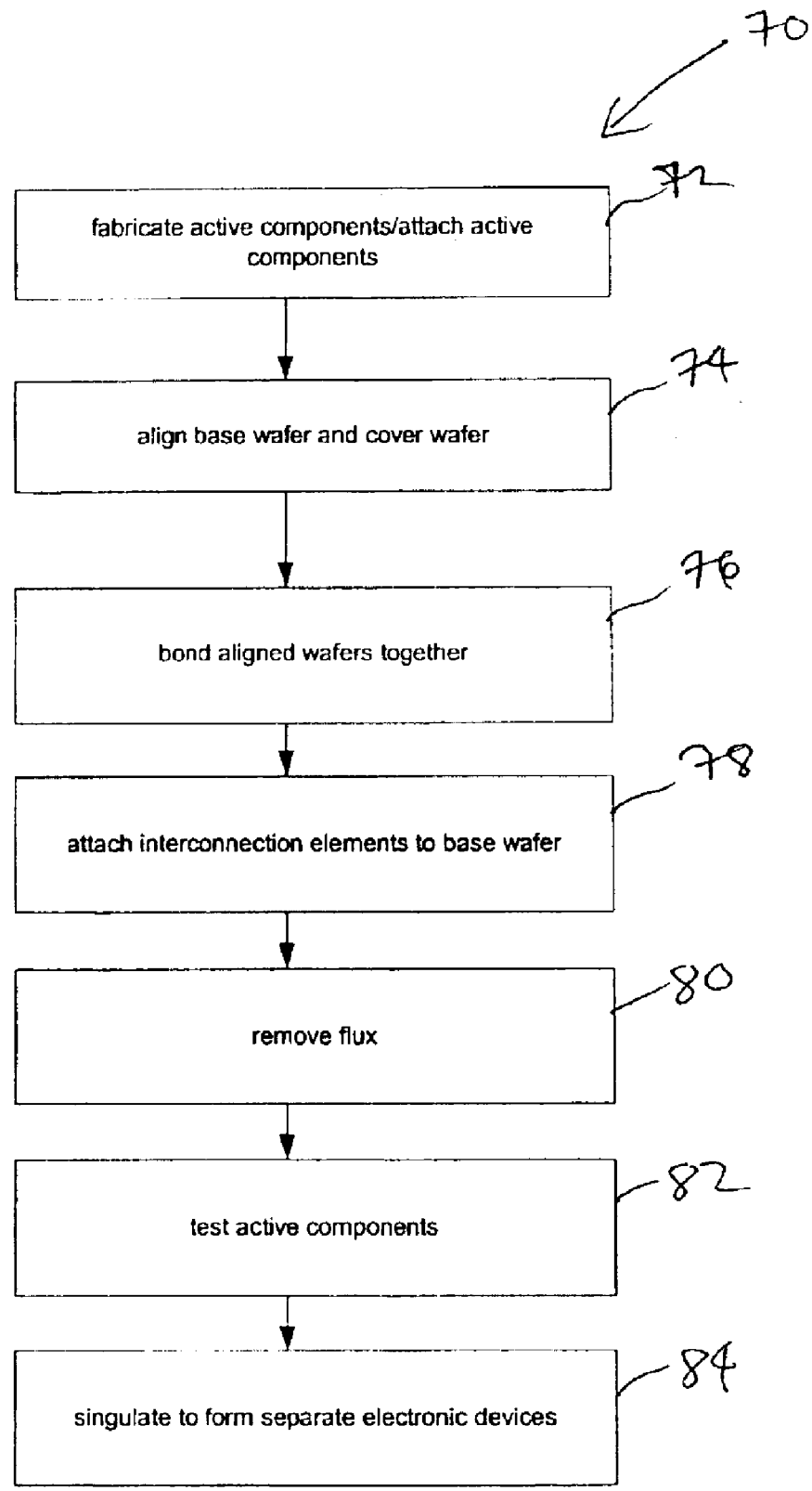
FIG. 6 shows a flowchart of operations performed in order to form an electronic device in accordance with one embodiment of the invention.
Figure 7:
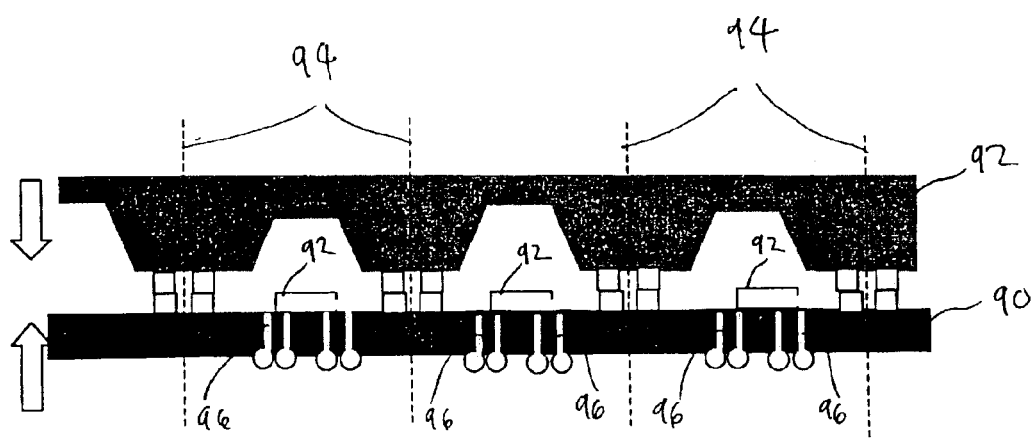
FIG. 7 illustrates a stage in the foundation of an electronic device in accordance with the operations of FIG. 6.

Referring now to FIG. 6 of the drawings reference numeral 70 generally indicates a sequence of operations performed in order to form the electronic device 10 using wafer blanks 40 that have been processed in accordance with the techniques illustrated in FIGS. 2 to 5 of the drawings. Starting at block 72 in one embodiment active components are fabricated on a base wafer, (i.e., a blank wafer 40 processed in accordance with the operations shown in FIG. 2 of the drawings) using standard techniques. In other embodiments prefabricated and singulated active components may be attached to the base wafer using standard techniques. An example of a base wafer after completion of block 72 is shown in FIG. 7 of the drawings, and identified by reference numeral 90. Referring to FIG. 7, it will be seen that the base wafer 90 includes a plurality of active components 92 (only three of which have been shown) which may be fabricated directly on the base wafer 90, or attached thereto as explained above. The active component may be an integrated device that contains several circuits, sensors and discrete integrated electrical components. Examples of active components include integrated circuit structures, sensors such as accelerometers, and micro-machined structures.

Referring again to FIG. 6, at block 74 the base wafer 90 is aligned with a cover wafer 92 (see FIG. 7). A cover wafer to a blank wafer 90 processed in accordance with the operations shown in FIG. 4 of the drawings. As will be seen, when the base wafer 90 is aligned with the cover wafer 92, the metal stand-offs on the base wafer 90 are aligned with the metal stand-offs of the cover wafer 92.

At block 76, the aligned base wafer 90 and cover wafer 92 are bonded together. This may be achieved using standard solder techniques to solder the stand-offs of the base wafer 90 and the cover wafer 92 together. In other embodiments, the base wafer 90 may be bonded to the cover wafer 92 using anodic bonding techniques or other bonding techniques. Thereafter at block 78, electrical interconnection elements are mounted to an underside of the base wafer 90. In one embodiment, the electrical interconnection elements may be in a form of conductive bumps which are attached to the underside of the base wafer 90 using a solder reflow technique. The solder bumps are in electrical contact with electrical leads extending from the active components 92 through the vias 96 in the base section 90.

At block 80, any remaining flux used in the solder process is removed. At block 82, the active components 92 are tested, and at block 84, a singulation operation is performed wherein the bonded base wafer 90 and cover wafer 92 is sliced to form discrete or separate electronic devices such as the electronic device 10 shown in FIG. 1 of the drawings. The singulation operation may be performed using conventional singulation techniques such as die-sawing, scribe-and-break techniques, etc. The purpose of the singulation trenches 64 is to facilitate the singulation operation. The singulation operation is performed along singulation lines 94, as illustrated in FIG. 7 of the drawings.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

What is claimed is:

1. A method, comprising:
   supporting a plurality of active electronic components on a first wafer;
   shaping a second wafer to define a plurality of spaces, each to accommodate one of the active electronic components when the second wafer is aligned and brought into face-to-face contact with the first wafer in a contact position;
   moving the second wafer into the contact position; and
   bonding the second wafer to the first wafer in the contact position.

2. The method of claim 1, further comprising a prior operation of forming vias in the first wafer and forming electrical leads from each active electronic component, the leads extending through the vias.

3. The method of claim 1, wherein the bonding comprises soldering solder wetable stand-offs on the first and second wafers.

4. The method of claim 3, further comprising a prior operation of forming the solder wetable stand-offs.

5. The method of claim 4, wherein forming the solder wetable stand-offs comprises depositing a metal layer on each of the first and second wafers, and patterning the first and second wafers to define the stand-offs.

6. The method of claim 5, wherein shaping the second wafer comprises etching a substrate of the second wafer using the patterned metal stand-offs as a mask.

7. The method of claim 1, further comprising performing a singulation operation to form separate devices each comprising a single active electronic component encapsulated by portions of the first and second wafers.

8. The method of claim 1, wherein the supporting comprises attaching each active component to the first wafer.

9. The method of claim 1, wherein the supporting comprises forming each active electronic component on the first wafer.

10. The method of claim 1, wherein each active electronic component comprises a MEMS device.

11. The method of claim 10, wherein the MEMS device is a radio frequency MEMS device.

12. The method of claim 11, further comprising coating the first and second wafers with a material to shield the MEMS device from radio frequency interference.

* * * * *